United States Patent [19]

Arnould et al.

[11] Patent Number: 4,620,213

[45] Date of Patent: Oct. 28, 1986

[54] DEEP-GRID SEMICONDUCTOR DEVICE

[75] Inventors: Jacques Arnould; Eugéne Tonnel, both of Paris, France

[73] Assignee: Thomson-CSF, Paris, France

[21] Appl. No.: 566,963

[22] Filed: Dec. 29, 1983

Related U.S. Application Data

[63] Continuation of Ser. No. 253,265, Apr. 13, 1981.

[30] Foreign Application Priority Data

Apr. 14, 1980 [FR] France ................... 80 08271

[51] Int. Cl.[4] ................. H01L 29/06; H01L 23/48; H01L 29/44; H01L 29/52
[52] U.S. Cl. ........................... 357/55; 357/13; 357/20; 357/56; 357/65; 357/68; 357/88; 357/91
[58] Field of Search ............ 357/20, 55, 65, 68, 357/13, 15, 46, 56, 88, 91

[56] References Cited

U.S. PATENT DOCUMENTS

| | | | |
|---|---|---|---|
| 3,436,279 | 4/1969 | Klein | 357/56 |
| 3,755,001 | 8/1973 | Kool et al. | 357/55 X |
| 3,927,418 | 12/1975 | Ando et al. | 357/55 |
| 4,003,126 | 1/1977 | Holmes et al. | 357/55 |
| 4,036,672 | 7/1977 | Kobayashi | 357/22 |
| 4,047,195 | 8/1977 | Allison | 357/55 |
| 4,062,036 | 12/1977 | Yoshido | 357/20 |
| 4,329,772 | 5/1982 | Oikawa et al. | 357/55 |

FOREIGN PATENT DOCUMENTS

| | | |
|---|---|---|
| 1470898 | 1/1967 | France ................... 357/56 |
| 2381373 | 9/1978 | France . |
| 2026237 | 1/1980 | United Kingdom . |

OTHER PUBLICATIONS

Ammar, E. S., & Rodgers, T. J., "UMOS Transistors on (110) Silicon", *IEEE Trans. on Electron Devices*, vol. ED-27, No. 5, May 1980, received May 1979, revised 9-1979.

*Primary Examiner*—James J. Carroll
*Attorney, Agent, or Firm*—Cushman, Darby & Cushman

[57] ABSTRACT

A semiconductor device has a deep control grid. A silicon substrate is grooved. The side walls and the bottom of the grooves are oxidized. Under the bottom of the grooves a dopant is implanted and diffused. A main metalization covering the grooved face makes a contact with the surface thereof and the parts of this metalization falling in the grooves does not cause any parasitic effect as the walls and the bottom of the grooves are insulated.

2 Claims, 6 Drawing Figures

DEEP-GRID SEMICONDUCTOR DEVICE

This is a continuation of application Ser. No. 253,265, filed Apr. 13, 1981.

BACKGROUND OF THE INVENTION

The present invention relates to localized deep-grid semiconductor structures and a process for manufacturing same. It relates more particularly to an application to diodes capable of being disabled by field effect.

In different types of discrete or integrated semiconductor components, such as high-power bipolar transistors, gate turn-off thyristors, junction power vertical field-effect transistors and others, a localized deep layer in the form of a grid is disposed inside the semiconductor wafer in a plane parallel to that of the principal faces of this wafer.

Such deep layers are currently designated in the technique by the expression "buried grids" because of the conventional manufacturing process of the prior art by which they were obtained. In fact, starting with a semiconductor substrate, this process includes ion implanting therein dopant atoms of a type of conductivity corresponding to that of the grid which it was desired to obtain, then in forming above this substrate one or more epitaxial layers in which one or more diffusions are possibly formed. Such a structure is shown schematically in the accompanying FIG. 1. There can be seen therein the substrate 1 overlaid by an epitaxial layer 2 in which is formed a diffused zone 3. The buried layer or grid 4 is present at the limit between substrate 1 and epitaxial layer 2. Then, a contact is provided between the upper surface of the semiconductor wafer and the buried grid 4 by means of a deep diffusion 5. In numerous practial applications, grid 4 must have an extremely fine and well-defined pitch. Furthermore, this grid generally serves for turning off the semiconductor device. It is then necessary for the transverse resistivity of the grid layer to be as small as possible. Its doping level must then be very high. This high doping level makes it difficult to control with great accuracy the extent of the diffusion from the initially implanted layer so that the mesh of the grid do not close up. The control of this diffusion is very delicate to achieve parficularly because parasite diffusions of the implanted dopant may occur during formation of the epitaxial layer.

These drawbacks are all the more noticeable since, in numerous devices, attempts have been made to obtain in a practical way grid mesh dimensions of the order of a few microns. Furthermore, due to the very fact of using an epitaxial layer deposited on a substrate, the presence of defects at the epitaxial layer-substrate interface causes an excessive leak current from the grid junction which interferes with the proper operation of the device under satisfactory conditions.

Thus, an object of the present invention is to provide a novel deep-grid semiconductor device structure which palliates the structural or manufacturing drawbacks of the buried-grid devices of the prior art.

Another object of the present invention is to provide such a structure of the diode type capable of being disabled.

Another object of the present invention is to provide a novel process for manufacturing a deep-grid semiconductor device.

SUMMARY OF THE INVENTION

To attain these objects as well as others, the present invention provides a deep-grid semiconductor device structure comprising no buried layer under an epitaxial layer in accordance with the technique which has been adopted during these latter years.

Thus, the present invention provides a semiconductor device structure, comprising a semiconductor body having different layers of distinct conductivity type and/or doping level a first face of which comprises grooves, wherein the lateral walls and the bottom of the grooves are coated with an insulating agent, wherein the bottom of the grooves is separated by the insulating agent from a localized zone corresponding to this bottom, of particular selected type of conductivity and doping level. The grooves may optionally be filled with an insulating material. In a particular embodiment of the present invention, the semiconductor body is a silicon body and the different insulating layers mentioned are silica layers.

Although the present invention may be applied to the different fields mentioned above, a particular application considered relates to a diode capable of being disabled, i.e. a diode having thyristor behavior in which an initial flow of current in the forward direction may be prevented by application of an appropriate voltage to a deep grid. Nevertheless, as in the case of a thyristor, this diode cannot be "turned off", i.e. that its use cannot be reckoned on for interrupting the passage of a forward current but only for preventing it from being established initially when the voltage is applied to the terminals of the diode. In the case of this particular application, the semiconductor body comprises a substrate of a first conductivity type with low doping level coated on its first face with a first layer of the same type of conductivity as the substrate and with a high doping level and on its second face with a second layer of the opposite type of conductivity to that of the substrate and with a high doping level, the grooves mentioned previously being formed from the first face and passing through the first layer, the deep layer being a layer of the second type of conductivity with high doping level.

A particular process for manufacturing a semiconductor device in accordance with the present invention from a semiconductor body comprising layers of alternate types of conductivity makes use of two protection products capable of being selectively etched, the second product being an insulating product. This process comprises the steps of: coating the first face of the semiconductor body with a layer of the first protection product; forming substantially U-shaped grooves from the first face; coating the walls and the bottom of the grooves with a layer of the second protection product; subjecting the first face to ionic implantation in a direction perpendicular to this face, the implanted atoms not passing through the first protection product but passing through the second one at the level of the bottom of the grooves; carrying out appropriate annealing; removing the first protection product layer and depositing and etching contact-making metalizations.

The grooves may be formed by any known process, for example by ionic etching. However, in a particular embodiment of the present invention in which the semiconductor body is a silicon body, the first protection product is silicon nitride and the second protection product is silicon oxide or silica, the grooves may be formed by anisotropic etching. The silica layers coating the walls and the bottom of the grooves are formed by thermal oxidation. A final filling of the grooves may be obtained by depositing on the first face a silica layer doped with phosphorous and by causing it to run so as to fill the grooves.

DESCRIPTION OF THE DRAWINGS

These objects, characteristics and advantages as well as others of the present invention will be explained in more detail in the following description of particular embodiments made with reference to the accompanying figures in which.

DESCRIPTION OF THE PREFERRED EMBODIMENTS

It will be noted that these different figures are not drawn to scale, neither between them nor within the same figure, so as to better illustrate the features of the present invention, as is usual in the field of semiconductors.

Figure 2:
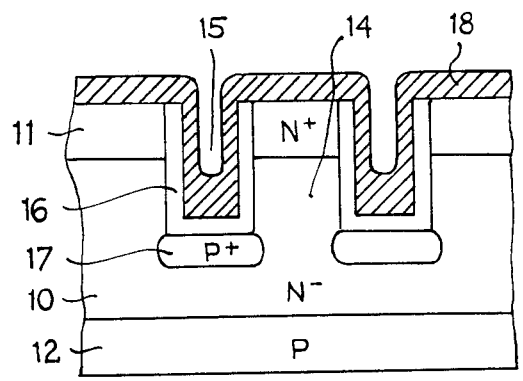
FIGS. 2 and 3 show sectional views of one embodiment of a deep-grid device of the diode type capable of being disabled in accordance with the present invention, these sections being taken along different planes and FIG. 3 also being in perspective.
Figure 3:
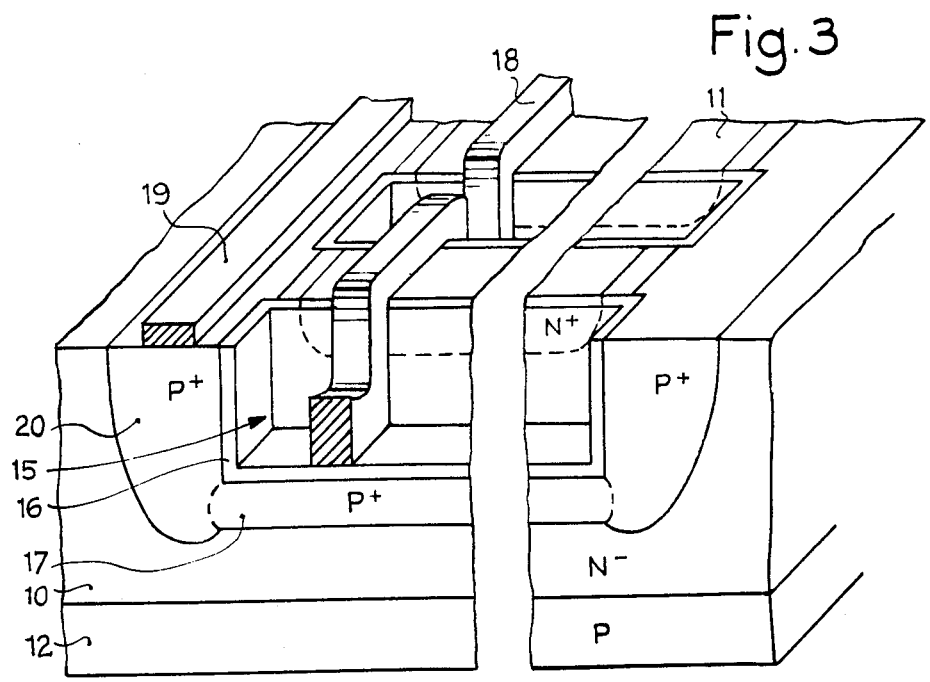

FIGS. 2 and 3 show views in partial cross and longitudinal section of one embodiment of a device of the diode type capable of being disabled in accordance with the present invention.

This device comprises a semiconductor body comprising an N$^-$ type substrate 10, an N$^+$ type layer 11 on its first face and a P$^+$ type layer 12 on its second face. Projecting zones 14 are defined by grooves 15. The walls and the bottom of these grooves are coated with a layer of an insulating material 16; the bottom of the grooves rests on a zone 17 with high doping level and P type conductivity.

As can be best seen in the perspective and longitudinal sectional view of FIG. 3, a metalization 18 is then deposited covering the greatest part of the first face or cathode of the diode. This metalization is only shown partially in FIG. 3 for the sake of clarity. It extends in fact over the greatest part of the principal face and practically over the whole length of the grooves. A part of the metalization penetrates into the grooves. It does not have nevertheless a harmful influence at this position for the grooves are insulated. If, because of the process for depositing the metalization and because of the particular structure of the furrows or grooves 15, the metalization breaks at the level of the edges of the grooves, that does not constitute a disadvantage to the extent that a pressure contact is then made on this metalization. FIG. 3 also shows a grid metalization 19 in electrically conducting relation with the P$^+$ type deep zone 17. Conduction between this metalization 19 and deep zone 17 is provided by a P$^+$ type wall or deep diffusion 20 formed at the longitudinal limit of the grooves and not making contact with the N$^+$ regions 11.

Of course, the structure shown in FIG. 3 is only given by way of illustration and is susceptible of numerous variations. Particularly, the grooves, instead of forming parallel strips may form a checkered pattern or have any other selected form. In the case where these grooves form a checkered pattern, it may be provided for one or more grooves to be wider than the others and for the insulating layer on the bottom of these grooves to be removed so as to deposit therein directly the grid contact metalization 19 while avoiding the formation of wall 20. It will be further noted that this wall, when it exists, is preferably formed by deep diffusion before formation of the grooves so as to avoid a long diffusion step during which layer 17 which is preferably formed by implantation as will be seen hereafter, would be likely to diffuse in an excessive way. According to another variation of the present invention, before going ahead with depositing metalization 18, the grooves may be filled with an insulating material so as to avoid parasite phenomena such as ruptures of the metalization layer 18, mentioned above.

Thus a deep-grid structure may be obtained presenting, with respect to the buried-grid structures of the prior art, numerous structural advantages resulting particularly from the fact that the diffused zone 17 is clearly defined by the laterally insulated part 16 of the groove.

Figure 5:
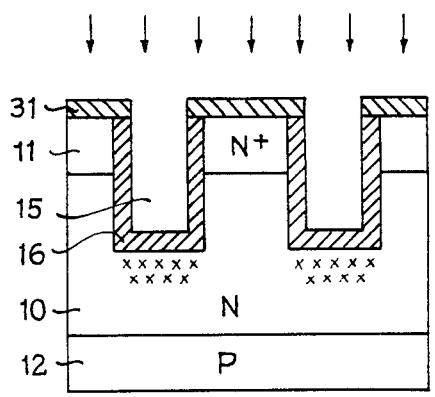
Figure 6:
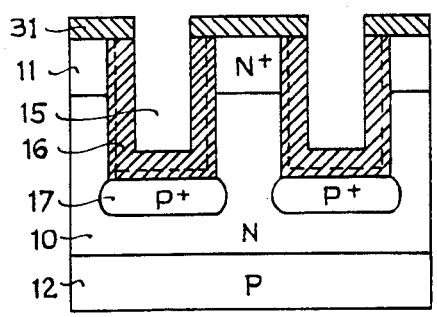

A process for manufacturing a structure such as shown in FIGS. 2 and 3 will now be described in more detail with reference to FIGS. 4 to 6.

Figure 4:
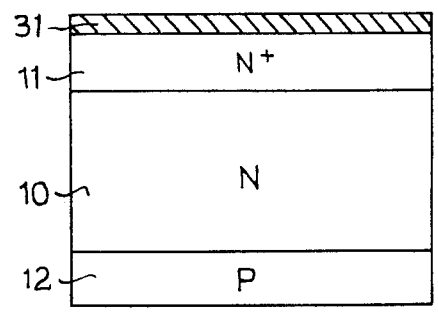
FIGS. 4 to 6 illustrate steps for manufacturing a device in accordance with the invention.

FIG. 4 shows a silicon body 10 and regions 11 and 12, on the first face or upper face of which a protection layer 31 is formed from silicon nitride ($Si_3N_4$). U-shaped grooves 15 may be formed therein in any known way, for example by ionic etching. Starting with a silicon substrate with orientation (1, 1, 0), apertures may be formed at selected positions in the silicon nitride layer, for example in accordance with a parallelogram checkered pattern having angles of 70° and 110° (not shown). These apertures in the silicon nitride layer serve as an etching mask for anisotropic etching of the wafer and for providing the U-shaped grooves 15 shown in FIG. 5. The edges of the apertures are then aligned in directions (2, 1, 1) and the lateral faces are formed by planes (1, 1, 1). A thermal heating step in an oxidizing atmosphere allows the walls and the bottom of the grooves to be oxidized so as to form an insulating layer 16 of silica ($SiO_2$).

Then implantation of ions, of boron for example, is carried out conferring a P$^+$ type on the silicon, with an incidence perpendicular to the surface of the wafer so as to achieve this implantation in the substrate through the silica layer located at the bottom of grooves 15. Of course, the relative thicknesses of the nitride layer 31 and of the thermal silica layer 16 are selected so as to avoid any implantation through the nitride layer 31. In FIG. 5, the vertical arrows show symbolically the normal implantation direction and the crosses below the bottoms of the grooves the implanted zones. Thus an implanted zone is obtained with strictly defined extent in conformation with the configuration of the bottoms of furrows or grooves 15.

In a subsequent step, shown in FIG. 6, annealing is carried out in an oxidizing atmosphere so as to cause the implanted ions to diffuse and so as to obtain the deep diffused zone 17 below the bottoms of the grooves. During this step, oxide layer 16 insulating the walls and the bottom of the grooves may be increased. In fact, it is possible that, following implantation, the insulating character of the bottom of the grooves is somewhat degraded.

Then, during subsequent steps, nitride layer 31 is removed by a selective etching process, for example by plasma etching, and the different metalizations are provided so as to produce a structure, for example of the type shown in FIGS. 2 and 3, forming a diode capable of being disabled. But, more generally, the present invention relates to a process for forming a deep grid under insulated grooves.

Figure 1:
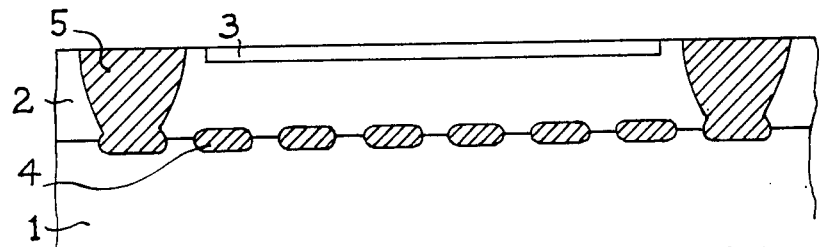
FIG. 1, which has already been described, was for recalling the state of the technique.

According to one of the advantages of the present invention, the step for forming the deep-grid layer 17 is one of the last steps of the manufacturing process and is followed by no other epitaxy or diffusion step likely to cause parasite diffusion in this zone 17. Thus, the depth or thickness of zone 17 from the groove may be controlled with great accuracy. Thus are avoided the diffusion phenomena which make so difficult technologically the formation of buried-grid structures with very fine pitch of the type shown in FIG. 1.

Using the above outlined techniques, a practical device may be obtained, for example a parallelepipedic grid having the following dimensional characteristics:

total depth of the grooves: 5 to 50 microns
distance between grooves: 10 to 15 microns
width of the grooves: 3 to 5 microns
width or depth of layer 17: 2 to 3 microns.

The present invention is not limited to the embodiments which have been more explicitly described. It comprises the different variations and generalizations thereof included within the scope of the following claims.

What is claimed is:

1. A diode structure that may be rendered non-conductive even when forwardly biased, comprising:

a central monocrystalline semiconductor layer of a first conductivity type that is doped to a first doping level, an upper semiconductor layer of said first conductivity type that is doped to a second level higher than said first doping level, said upper layer having an upper surface which constitutes a first major face of the structure, a lower semiconductor layer of a second conductivity type opposite to said first conductivity type, said lower layer having a lower face which constitutes a second major face of the substrate, there being grooves extending from said first major face through said upper layer and inside said central layer, each groove having wall portions and a bottom portion, an insulating layer entirely coating said wall portions and bottom portion, the insulating layer having a U-shape inside the groove, a continuous coating of conductive material on a major part of said upper surface and being in contact with said upper layer between said grooves and with said insulating layer on the wall and bottom portions of the grooves, said coating of conductive material having a U-shape inside each groove whereby the groove is not entirely filled with conductive material and/or insulating material, a buried zone of said second conductivity type formed within said central layer, adjacent to said bottom portion of each groove, said buried zone comprising separate individual portions each located precisely under a groove and having a high doping level, and means for electrically accessing said buried zone from said first major face of the structure outside said grooves.

2. A diode structure according to claim 1, wherein said accessing means comprise a deep diffusion region of the second type of a conductivity, extending outside the grooves from said upper surface through said upper layer and inside said central layer, said deep diffusion contacting said buried zone, and a conductive element in contact with said deep diffusion region on said upper surface, said conductive element being separate from said continuous conductive layer.

* * * * *